US006733829B2

(12) United States Patent
Stacey et al.

(10) Patent No.: US 6,733,829 B2
(45) Date of Patent: May 11, 2004

(54) ANTI-BINDING DEPOSITION RING

(75) Inventors: Dave Stacey, Portland, OR (US); Jonathan Allinger, Sandy, OR (US); Allan Vescovi, Gresham, OR (US)

(73) Assignee: LSI Logic Corporation, Milpitas, CA (US)

( * ) Notice: Subject to any disclaimer, the term of this patent is extended or adjusted under 35 U.S.C. 154(b) by 74 days.

(21) Appl. No.: 10/106,128

(22) Filed: Mar. 19, 2002

(65) Prior Publication Data

US 2003/0177981 A1 Sep. 25, 2003

(51) Int. Cl.[7] .......................... H01L 21/00; C23C 16/00

(52) U.S. Cl. .................... 427/248.1; 118/728; 156/915; 156/916; 361/234

(58) Field of Search ................................ 156/915, 916; 361/234; 118/504; 427/248.1

(56) References Cited

U.S. PATENT DOCUMENTS 5,863,340 A * 1/1999 Flanigan ..................... 118/728
6,033,480 A * 3/2000 Chen et al. ................. 118/715
6,423,636 B1 * 7/2002 Dordi et al. ................ 438/678

* cited by examiner

*Primary Examiner*—Gregory Mills
*Assistant Examiner*—Ram N Kackar
(74) *Attorney, Agent, or Firm*—Trexler, Bushnell, Giangiorgi, Blackstone & Marr Ltd.

(57) ABSTRACT

A deposition ring which has a cut out on its interior circumferential edge. The deposition ring is configured to contact an edge of an electrostatic chuck and shield at least a portion of the electrostatic chuck during a deposition process wherein material is deposited onto an item, such as a semiconductor wafer, which is disposed on the electrostatic chuck. The interior circumferential edge of the deposition ring includes a surface portion which is configured to engage the edge of the electrostatic chuck, and includes the cut out portion which is configured to be spaced away and not contact the edge of the electrostatic chuck during the deposition process. As such, the deposition ring does not tend to bind with the electrostatic chuck during the deposition process.

23 Claims, 2 Drawing Sheets

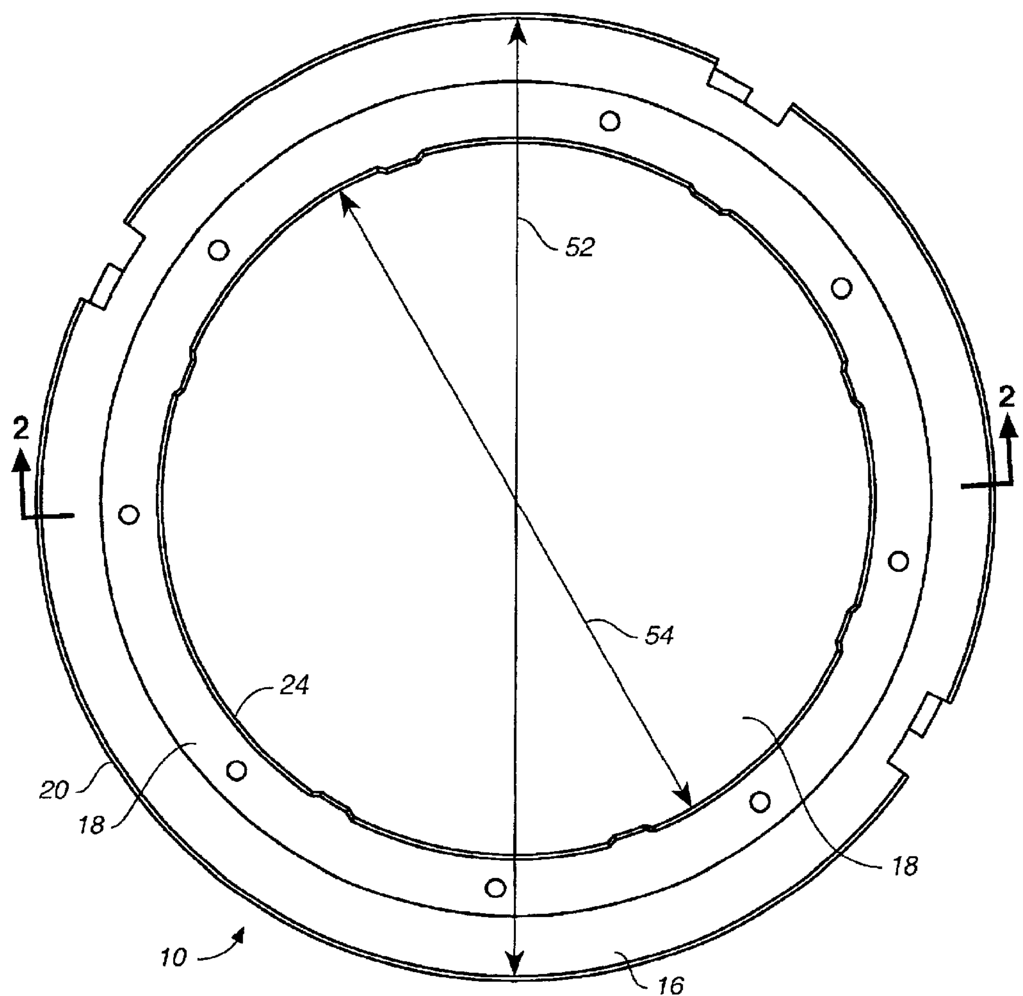
FIG._1
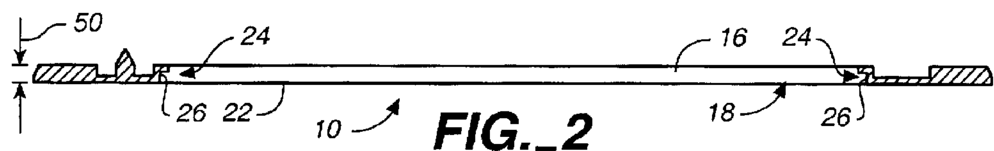
FIG._2

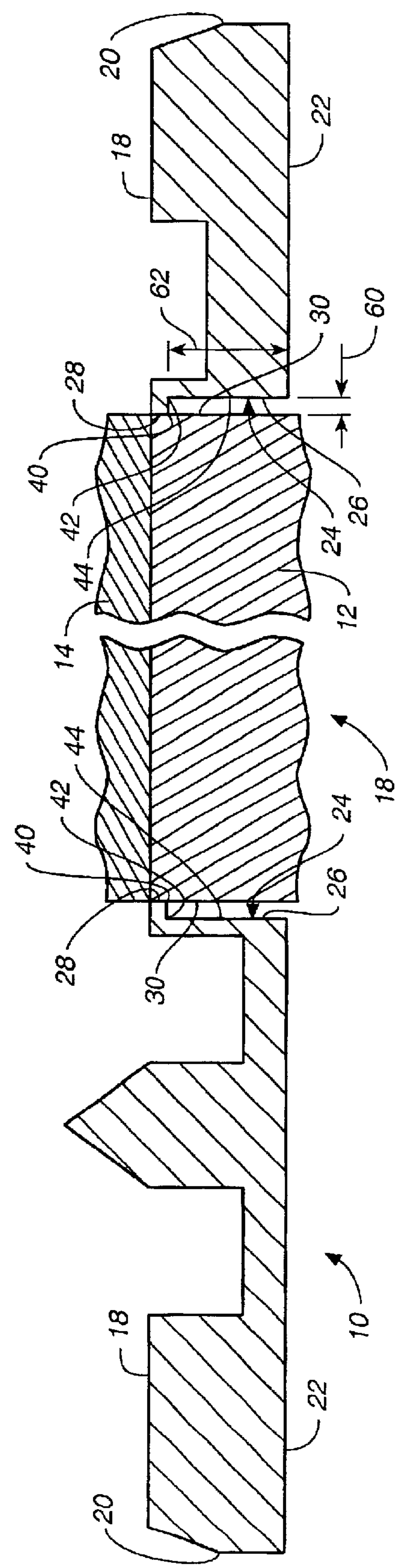
FIG._3

ANTI-BINDING DEPOSITION RING

BACKGROUND

The present invention generally relates to deposition rings which engage electrostatic chucks in a deposition process for making a semiconductor, and more specifically relates to a deposition ring which includes a cut out on its interior circumferential edge to prevent binding of the deposition ring to an electrostatic chuck during a processing operation, such as during a physical vapor deposition process, wherein a material is deposited onto a semiconductor wafer.

It takes several steps to make a semiconductor. Typically, one of the steps involves depositing a material, such as aluminum, onto a semiconductor wafer. Physical vapor deposition ("PVD") is one process which can be used to make such a deposit onto a semiconductor wafer. During PVD, a robot arm places a semiconductor wafer on an electrostatic chuck in a chamber. A deposition ring is engaged (i.e., in contact) with the edge of the electrostatic chuck, and the engagement of the deposition ring with the electrostatic chuck provides that the material which is to be deposited onto the semiconductor wafer is prevented from depositing onto the electrostatic chuck. Shielding the electrostatic chuck during the deposition process is important because electrostatic chucks can be quite expensive, and depositing a material such as aluminum onto an electrostatic chuck can cause the electrostatic chuck to short or be adversely affected mechanically.

Once the wafer has been placed on the electrostatic chuck in the deposition chamber, and the deposition ring is engaged with electrostatic chuck, the chamber is sealed and the material, such as aluminum, is deposited onto the semiconductor wafer. The nature of the PVD process provides that the material is effectively deposited on everything in the chamber. As such, the material deposits onto, among other things, the semiconductor wafer and the deposition ring. As discussed above, the deposition ring effectively shields the electrostatic chuck during the deposition process, which is important in light of the expense of an electrostatic chuck.

While the use of a deposition ring successfully shields the electrostatic chuck during the deposition process, deposition rings sometimes bind to electrostatic chucks during the deposition process. Thereafter, once the deposition process is finished, attempting to disengage the deposition ring from the electrostatic chuck can result in damage to the electrostatic chuck. As discussed above, causing damage to the electrostatic chuck is to be prevented since, in general, electrostatic chucks are expensive.

Typically, a process kit is used in the deposition process. A process kit may consist of, among other things, shields which are placed in the chamber, as well as the deposition ring. Every once in a while, as a matter of standard practice, the process kit is changed. Specifically, a new process kit is installed, and the old process kit is processed, such as dipped in a bath, in order to remove the deposit on the kit. Thereafter, the old process kit (at least some parts thereof), can be re-used.

As a general rule, the longer a deposition ring is used, the more material becomes deposited thereon. The more material which becomes deposited on a deposition ring, the more prone the deposition ring is to binding to the electrostatic chuck during the deposition process. As such, in order to prevent binding of the deposition ring to the electrostatic chuck during the deposition process, the overall amount of deposition is limited between process kit changes. For example, the life of a process kit may be limited to 400 kilowatt-hours to prevent binding, despite the fact that it would be desirable to use the process kit for much longer, such as for 800 kilowatt-hours.

The theory in limiting the life of a process kit is: the less material (such as aluminum) which is deposited onto a deposition ring, the more effective the deposition ring will shield the electrostatic chuck during the deposition process, and the less likely there will be unacceptable deposition around the outside edge of the electrostatic chuck (i.e., at the juncture with the deposition ring). If there is not significant deposition along the outside edge of the electrostatic chuck, then the deposition ring should not bind with, and should readily disengage from, the electrostatic chuck when the process kit is changed.

While limiting the amount of deposition between process kit changes may reduce the likelihood that there will be binding between the deposition ring and the electrostatic chuck, doing so can be expensive. For example, at five thousand wafer starts per week, process kit costs can amount to as much as $40,000 per month, not including tool downtime which is necessary to perform the required maintenance (i.e., changing of the shields, deposition ring, etc.). Limiting process kit life not only increases cost, but doing so does not address the root cause of the problem—the fact that, due to deficient design, deposition rings are prone to binding to electrostatic chucks during the deposition process.

OBJECTS AND SUMMARY

A general object of an embodiment of the present invention is to provide a deposition ring which does not tend to bind with an electrostatic chuck during a deposition process.

Another object of an embodiment of the present invention is to provide a deposition ring which can be used longer before risking binding of the deposition ring to the electrostatic chuck during the deposition process.

Still another object of an embodiment of the present invention is to provide a method of using a deposition ring to shield an electrostatic chuck during a deposition process.

Briefly, and in accordance with at least one of the forgoing objects, an embodiment of the present invention provides a deposition ring which is configured to contact an edge of a chuck and shield at least a portion of the chuck during a deposition process wherein material is deposited onto an item disposed on the chuck. The deposition ring includes a body, and the body having an interior circumferential edge. The interior circumferential edge includes a surface portion which is configured to engage the edge of the chuck when the deposition ring is engaged with the edge of the chuck, and includes a cut out portion which is configured to be spaced away and not contact the edge of the chuck when the deposition ring is engaged with the edge of the chuck. The cut out provides that the deposition ring does not tend to bind with the electrostatic chuck during the deposition process.

The chuck may be an electrostatic chuck. Preferably, the surface portion of the interior circumferential edge of the deposition ring is proximate the cut out portion. The body of the deposition ring may be circular-shaped. Preferably, when the deposition ring is laid flat, the interior circumferential edge comprises a first, vertical surface, a second, horizontal surface, and a third, vertical surface, wherein the first surface intersects the second surface, and the second surface intersects the third surface. While the first surface comprises the surface portion and is configured to engage the edge of the chuck when the deposition ring is engaged with the edge of the chuck, the second and third surfaces define the cut out portion of the interior circumferential edge of the deposition ring which is configured to be spaced away and not contact the edge of the chuck. Preferably, the third surface is longer than, such as four times longer than, the first surface.

BRIEF DESCRIPTION OF THE DRAWINGS

The organization and manner of the structure and operation of the invention, together with further objects and advantages thereof, may best be understood by reference to the following description, taken in connection with the accompanying drawings, wherein like reference numerals identify like elements in which:

FIG. 1 is a top, plan view of a deposition ring;

FIG. 2 is a cross-sectional view, taken along line 2—2 of FIG. 1, of the deposition ring shown in FIG. 1, where the deposition ring is in accordance with an embodiment of the present invention and includes a cut out portion on its interior circumferential edge; and FIG. 3 is a cross-sectional view showing the deposition ring of FIGS. 1 and 2 engaged with an electrostatic chuck.

DESCRIPTION

While the invention may be susceptible to embodiment in different forms, there is shown in the drawings, and herein will be described in detail, a specific embodiment with the understanding that the present disclosure is to be considered an exemplification of the principles of the invention, and is not intended to limit the invention to that as illustrated and described herein.

FIG. 1 is a top, plan view of a deposition ring 10 which is configured to contact and shield a chuck 12 during a processing operation. More specifically, as shown in FIG. 3, the deposition ring 10 is configured to engage and generally seal around the portion of an electrostatic chuck 12 on which a semiconductor wafer 14 sits during a deposition process, such as during a PVD process during which aluminum is deposited onto the semiconductor wafer 14 (in FIG. 3, the electrostatic chuck 12 and semiconductor wafer 14 are shown cut away to simplify the illustration).

As shown in FIG. 1, the deposition ring 10 is preferably generally circular, and includes a body 16, where the body 16 defines a central open area 18 in which the electrostatic chuck 12 sits (see FIG. 3). The body 16 of the deposition ring 10 defines a top edge 18, an exterior circumferential edge 20, a bottom edge 22 (which is not shown in FIG. 1, but is depicted generally in FIG. 2), and an interior circumferential edge 24. The deposition ring 10 may have other detail which is omitted from the FIGURES herein because such detail is not relevant to the present invention.

As shown in FIGS. 2 and 3, the deposition ring 10 is in accordance with an embodiment of the present invention, and provides that the interior circumferential edge 24 includes a cut out portion 26. As shown in FIG. 3, while surface portion 28 of the interior circumferential edge 24 of the deposition ring 10 is configured to contact the edge 30 of the electrostatic chuck 12, the cut out portion 26 is configured to be spaced away from and not contact the edge 30 of the electrostatic chuck 12. As such, the overall surface area of contact between the deposition ring 10 and electrostatic chuck 12 is reduced, thereby providing that the deposition ring 10 does not tend to bind to the electrostatic chuck 12 during the deposition process. After the deposition process, the deposition ring 10 can be readily removed from the electrostatic chuck 12 without damaging the electrostatic chuck 12. The cut out portion 26 in the interior circumferential edge 24 of the deposition ring 10 also provides that the deposition ring 10 can be used for a longer period of time, such as for 800 kilowatt-Hours, without there resulting a high risk that the deposition ring 10 will bind to the electrostatic chuck 12 during the deposition process.

As shown in FIGS. 2 and 3, the surface portion 28 of the interior circumferential edge 24 of said deposition ring 10 is proximate the cut out portion 26, and the deposition ring 10 is configured such that when the deposition ring 10 is horizontal or laid flat (as shown in FIGS. 2 and 3), the interior circumferential edge 24 comprises a first, vertical surface 40, a second, horizontal surface 42, and a third, vertical surface 44, wherein the first surface 40 intersects the second surface, 42 and the second surface 42 intersects the third surface 44. The first surface 40 effectively comprises the surface portion 28 which contacts the edge 30 of the electrostatic chuck 12. The second and third surfaces 42, 44 define the cut out portion 26 of the interior circumferential edge 24 of the deposition ring 10 which is configured to be spaced away from and not contact the edge 30 of the electrostatic chuck 12 when the deposition ring 10 is engaged with the electrostatic chuck 12.

As shown in FIG. 3, preferably the third surface 44 is longer than the first surface 40 such that the cut out portion 26 consumes at least fifty percent of the height (dimension 50 in FIG. 2) of the deposition ring 10. Ideally, the cut out portion 26 is about eighty percent of the height of the deposition ring 10. As such, the third surface 44 is about four times as long as the first surface 40.

With regard to dimensions, the deposition ring 10 may have an outside diameter (i.e., defined by the exterior circumferential edge) of 10–12 inches (dimension 52 in FIG. 1), an inside diameter (i.e., defined by the interior circumferential edge) of 7–9 inches (dimension 54 in FIG. 1), and may have a thickness (i.e., from the top surface to the bottom surface) of 0.15–0.20 inches (dimension 50 in FIG. 2). The cut out portion 26 which is provided in the interior circumferential edge 24 may be approximately 0.004 to 0.005 inches deep (dimension 60 in FIG. 3) and 0.13 to 0.15 inches tall (dimension 62 in FIG. 3). Of course, other dimensions for the deposition ring 10 and cut out portion 26 are entirely possible and dimensions are only given herein as an example of one possible embodiment.

While an embodiment of the present invention is shown and described, it is envisioned that those skilled in the art may devise various modifications of the present invention without departing from the spirit and scope of the appended claims.

What is claimed is:

1. A method of using a deposition ring to shield at least a portion of a chuck during a deposition process wherein material is deposited onto an item disposed on the chuck, said method comprising: providing a deposition ring which includes a body, said body having an interior circumferential edge, said interior circumferential edge including a surface potion at the top and a cut out portion at the bottom; and engaging the deposition ring with the chuck such that the surface portion of the deposition ring contacts a vertical edge of the chuck proximate a top surface of the chuck, and said cut out portion is spaced away from and does not contact the edge of the chuck, wherein the cut out portion of the interior circumferential edge of said chuck is spaced further away from the top surface of the chuck than is said surface portion of the deposition ring which contacts the edge of the chuck.

2. A method as defined in claim 1, further comprising engaging the deposition ring with an electrostatic chuck.

3. A method as defined in claim 1, further comprising providing that said surface portion of said interior circumferential edge of said deposition ring is proximate said cut out portion of said interior circumferential edge of said deposition ring.

4. A method as defined in claim 1, further comprising providing that said body of said deposition ring is circular-shaped.

5. A method as defined in claim 1, further comprising providing that when said deposition ring is laid flat, said interior circumferential edge comprises a first, vertical surface, a second, horizontal surface, and a third, vertical surface, wherein said first surface intersects said second surface, and said second surface intersects said third surface, wherein said first surface comprises said surface portion and is configured to contact the edge of the chuck when the deposition ring is engaged with the edge of the chuck.

6. A method as defined in claim 5, further comprising providing that said second and third surfaces define said cut out of said interior circumferential edge of said deposition ring.

7. A method as defined in claim 5, further comprising providing that said third surface is longer than said first surface.

8. A method as defined in claim 5, further comprising providing that said third surface is at least twice as long as said first surface.

9. A method as defined in claim 5, further comprising providing that said third surface is at least three times as long as said first surface.

10. A method as defined in claim 5, further comprising providing that said third surface is at least four times as long as said first surface.

11. A method as defined in claim 1, wherein the surface portion of the deposition ring intersects a top surface portion of the deposition ring, said method further comprising engaging the deposition ring with the chuck such that the top surface portion of the deposition ring is flush with a top surface of the chuck.

12. A method of using a deposition ring to shield at least a portion of an electrostatic chuck during a deposition process wherein material is deposited onto an item disposed on the electrostatic chuck, said method comprising: providing a deposition ring which includes a body, said body having an interior circumferential edge, said interior circumferential edge including a surface portion at the top and a cut out portion at the bottom; engaging the deposition ring with the electrostatic chuck such that the surface portion of the deposition ring contacts a vertical edge of the electrostatic chuck and said cut out portion is spaced away from and does not contact the edge of the electrostatic chuck, further comprising providing that when said deposition ring is laid flat, said interior circumferential edge comprises a first, vertical surface, a second, horizontal surface, and a third, vertical surface, wherein said first surface intersects said second surface, and said second surface intersects said third surface, wherein said first surface comprises said surface portion and is configured to contact the edge of the chuck when the deposition ring is engaged with the edge of the chuck, further comprising providing that said third surface is longer than said first surface.

13. A method as defined in claim 12, further comprising providing that said surface portion of said interior circumferential edge of said deposition ring is proximate said cut out portion of said interior circumferential edge of said deposition ring.

14. A method as defined in claim 12, further comprising providing that said body of said deposition ring is circular-shaped.

15. A method of using a deposition ring to shield at least a portion of an electrostatic chuck during a deposition process wherein material is deposited onto an item disposed on the electrostatic chuck, said method comprising: providing a deposition ring which includes a body, said body having an interior circumferential edge, said interior circumferential edge including a surface portion at the top and a cut out portion at the bottom; engaging the deposition ring with the electrostatic chuck such that the surface portion of the deposition ring contacts a vertical edge of the electrostatic chuck and said cut out portion is spaced away from and does not contact the edge of the electrostatic chuck, further comprising providing that when said deposition ring is laid flat, said interior circumferential edge comprises a first, vertical surface, a second, horizontal surface, and a third, vertical surface, wherein said first surface intersects said second surface, and said second surface intersects said third surface, wherein said first surface comprises said surface portion and is configured to contact the edge of the chuck when the deposition ring is engaged with the edge of the chuck, further comprising providing that said third surface is at least twice as long as said first surface.

16. A method as defined in claim 15, further comprising providing that said surface portion of said interior circumferential edge of said deposition ring is proximate said cut out portion of said interior circumferential edge of said deposition ring.

17. A method as defined in claim 15, further comprising providing that said body of said deposition ring is circular-shaped.

18. A method of using a deposition ring to shield at least a portion of an electrostatic chuck during a deposition process wherein material is deposited onto an item disposed on the electrostatic chuck, said method comprising: providing a deposition ring which includes a body, said body having an interior circumferential edge, said interior circumferential edge including a surface portion at the top and a cut out portion at the bottom; engaging the deposition ring with the electrostatic chuck such that the surface portion of the deposition ring contacts a vertical edge of the electrostatic chuck and said cut out portion is spaced away from and does not contact the edge of the electrostatic chuck, further comprising providing that when said deposition ring is laid flat, said interior circumferential edge comprises a first, vertical surface, a second, horizontal surface, and a third, vertical surface, wherein said first surface intersects said second surface, and said second surface intersects said third surface, wherein said first surface comprises said surface portion and is configured to contact the edge of the chuck when the deposition ring is engaged with the edge of the chuck, further comprising providing that said third surface is at least three times as long as said first surface.

19. A method as defined in claim 18, further comprising providing that said surface portion of said interior circumferential edge of said deposition ring is proximate said cut out portion of said interior circumferential edge of said deposition ring.

20. A method as defined in claim 18, further comprising providing that said body of said deposition ring is circular-shaped.

21. A method of using a deposition ring to shield at least a portion of an electrostatic chuck during a deposition process wherein material is deposited onto an item disposed on the electrostatic chuck, said method comprising: providing a deposition ring which includes a body, said body having an interior circumferential edge, said interior circumferential edge including a surface portion at the top and a cut out portion at the bottom; engaging the deposition ring with the electrostatic chuck such that the surface portion of the deposition ring contacts a vertical edge of the electrostatic chuck and said cut out portion is spaced away from and does not contact the edge of the electrostatic chuck, further comprising providing that when said deposition ring is laid flat, said interior circumferential edge comprises a first, vertical surface, a second, horizontal surface, and a third, vertical surface, wherein said first surface intersects said second surface, and said second surface intersects said third surface, wherein said first surface comprises said surface portion and is configured to contact the edge of the chuck when the deposition ring is engaged with the edge of the chuck, further comprising providing that said third surface is at least four times as long as said first surface.

22. A method as defined in claim 21, further comprising providing that said surface portion of said interior circumferential edge of said deposition ring is proximate said cut out portion of said interior circumferential edge of said deposition ring.

23. A method as defined in claim 21, further comprising providing that said body of said deposition ring is circular-shaped.

* * * * *